(12) United States Patent
Hwang

(10) Patent No.: US 12,725,908 B2
(45) Date of Patent: Sep. 1, 2026

(54) BMS COMMUNICATION SYSTEM AND ESS COMMUNICATION SYSTEM THAT WIRELESSLY COMMUNICATE WITH EACH OTHER

(71) Applicant: Samsung SDI Co., Ltd., Yongin-si (KR)

(72) Inventor: Yusik Hwang, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 111 days.

(21) Appl. No.: 18/741,402

(22) Filed: Jun. 12, 2024

(65) Prior Publication Data

US 2025/0279572 A1 Sep. 4, 2025

(30) Foreign Application Priority Data

Feb. 29, 2024 (KR) ........................ 10-2024-0030002

(51) Int. Cl.
*H01Q 1/22* (2006.01)
*H01M 10/42* (2006.01)
(Continued)

(52) U.S. Cl.
CPC ............ *H01Q 1/22* (2013.01); *H01M 10/425* (2013.01); *H01M 10/486* (2013.01);
(Continued)

(58) Field of Classification Search
CPC .......... H01Q 1/22; H01Q 9/0421; H01Q 1/38; H01Q 1/50; H01Q 1/2291; H01M 10/425;
(Continued)

(56) References Cited

U.S. PATENT DOCUMENTS

| | | | |
|---|---|---|---|
| 11,011,917 | B2 | 5/2021 | Park et al. |
| 2019/0033377 | A1 | 1/2019 | Don et al. |

(Continued)

FOREIGN PATENT DOCUMENTS

| | | | |
|---|---|---|---|
| DE | 10-2015-202566 A1 | 8/2016 |
| KR | 10-0720939 B1 | 5/2007 |

(Continued)

OTHER PUBLICATIONS

Extended European Search Report dated Feb. 18, 2025, in connection with European Application No. 24196098.8.

*Primary Examiner* — Seung H Lee
(74) *Attorney, Agent, or Firm* — Wolf, Greenfield & Sacks, P.C.

(57) ABSTRACT

A battery management system (BMS) communication system includes a battery module including a housing and a plurality of battery cells in which a battery cell comprises a voltage sensing tab, a first printed circuit board (PCB) mounted on a side of the housing of the battery module and including a temperature sensor electrically connected to the voltage sensing tab of the battery cell to measure a temperature of the battery cell, and a second PCB stacked on a surface of the first PCB and including a cell sensing module electrically connected to the voltage sensing tab and the temperature sensor to exchange signals therewith, in which an antenna pattern module is mounted on a surface of the second PCB.

20 Claims, 3 Drawing Sheets

(51) Int. Cl.

| | |
|---|---|
| ***H01M 10/48*** | (2006.01) |
| ***H01M 50/204*** | (2021.01) |
| ***H01M 50/284*** | (2021.01) |
| ***H01Q 9/04*** | (2006.01) |
| ***H05K 1/02*** | (2006.01) |
| ***H05K 1/14*** | (2006.01) |
| ***H05K 3/36*** | (2006.01) |

(52) U.S. Cl.
CPC ....... *H01M 50/204* (2021.01); *H01M 50/284* (2021.01); *H01Q 9/0421* (2013.01); *H05K 1/0243* (2013.01); *H05K 1/0277* (2013.01); *H05K 1/144* (2013.01); *H05K 3/36* (2013.01); *H01M 2010/4271* (2013.01); *H01M 2010/4278* (2013.01); *H05K 2201/10037* (2013.01); *H05K 2201/10098* (2013.01); *H05K 2201/10151* (2013.01)

(58) Field of Classification Search
CPC ............. H01M 10/486; H01M 50/204; H01M 50/284; H01M 2010/4271; H01M 2010/4278; H01M 10/48; H01M 10/4257; H01M 10/482; H01M 50/569; H01M 2220/10; H05K 1/0243; H05K 1/0277; H05K 1/144; H05K 3/36; H05K 2201/10037; H05K 2201/10098; H05K 2201/10151; Y02E 60/10; H02J 15/00; H04B 1/38; H04B 1/40; H04W 4/50
See application file for complete search history.

(56) References Cited

U.S. PATENT DOCUMENTS

| | | | | |
|---|---|---|---|---|
| 2020/0313284 | A1 | 10/2020 | Kim et al. | |
| 2023/0314519 | A1* | 10/2023 | Yoo ................... | H01M 10/4207 |
| 2023/0344027 | A1* | 10/2023 | Kang ................ | H01M 10/4207 |
| 2024/0030589 | A1 | 1/2024 | Hong | |
| 2025/0219169 | A1* | 7/2025 | Yu ..................... | H01M 10/4264 |

FOREIGN PATENT DOCUMENTS

| | | | | |
|---|---|---|---|---|
| KR | 10-2025638 | B1 | 9/2019 | |
| KR | 10-20025638 | B1 | 9/2019 | |
| KR | 10-2149731 | B1 | 8/2020 | |
| KR | 10-2020-0114150 | A | 10/2020 | |
| KR | 10-2020-0144376 | A | 12/2020 | |
| KR | 10-2203247 | B1 | 1/2021 | |
| KR | 10-2022-0038921 | A | 3/2022 | |
| KR | 10-2022-0138236 | A | 10/2022 | |
| KR | 10-2023-0004400 | A | 1/2023 | |
| KR | 10-2023-0055091 | A | 4/2023 | |
| WO | WO-2023101341 | A1 * | 6/2023 | ........... G01R 31/371 |

* cited by examiner

BMS COMMUNICATION SYSTEM AND ESS COMMUNICATION SYSTEM THAT WIRELESSLY COMMUNICATE WITH EACH OTHER

CROSS-REFERENCE TO RELATED APPLICATION

The present application claims priority and the benefit under 35 U.S.C. § 119 (a) of Korean Patent Application No. 10-2024-0030002, filed on Feb. 29, 2024, in the Korean Intellectual Property Office, the entire disclosure of which is incorporated herein by reference.

FIELD

One or more embodiments relate to a battery management system (BMS) communication system and an energy storage system (ESS) communication system.

BACKGROUND

A secondary battery can be charged and discharged, unlike a primary battery that cannot be recharged. Low-capacity secondary batteries are used in small portable electronic devices such as smartphones, feature phones, laptop computers, digital cameras, and camcorders, and high-capacity secondary batteries are used as motor-driving power sources, power-storing batteries, etc., for hybrid vehicles, electric vehicles, etc. Such a secondary battery may include an electrode assembly including a cathode and an anode, a case accommodating the electrode assembly, an electrode terminal connected to the electrode assembly, etc.

In an energy storage system (ESS) system including such a secondary battery, many complex wirings are installed and thus signal interference may occur therebetween, such that communication between battery management systems (BMSs) needs to be connected wirelessly.

The above-described information disclosed in the technology section that serves as the background of the present disclosure is only for improving the understanding of the background of the present disclosure, and thus may include information that does not constitute prior art.

SUMMARY

One or more embodiments include a BMS communication system and an ESS communication system that wirelessly communicate with each other.

However, technical problems to be solved by the present disclosure are not limited to the above-mentioned problem, and other problems not mentioned may be clearly understood by those of ordinary skill in the art from the description of the present disclosure described below.

Additional aspects will be set forth in part in the description which follows and, in part, will be apparent from the description, or may be learned by practice of the presented embodiments of the present disclosure.

According to one or more embodiments, a battery management system (BMS) communication system includes a battery module including a housing and a plurality of battery cells in which a battery cell includes a voltage sensing tab, a first printed circuit board (PCB) mounted on a side of the housing of the battery module and including a temperature sensor electrically connected to the voltage sensing tab of the battery cell to measure a temperature of the battery cell and a second PCB stacked on a surface of the first PCB and including a cell sensing module electrically connected to the voltage sensing tab and the temperature sensor to exchange signals therewith, in which an antenna pattern module is mounted on a surface of the second PCB.

According to an example, the second PCB may include a flexible PCB (FPCB).

According to another example, the antenna pattern module may include an antenna having an inverted-F antenna (IFA) structure.

According to another example, the antenna pattern module may include an antenna configured to operate in a 2.4 GHz band.

According to another example, the antenna pattern module may include an antenna having a pattern mounted on a surface of the FPCB, in which the pattern has a thickness of 0.18 mm.

According to another example, the antenna pattern module may include an antenna including an antenna horizontal portion, an impedance matching unit, and an antenna feeding unit, in which a length of the antenna horizontal portion is 13.5 mm, a length of the impedance matching unit is 4.05 mm, and a length between the impedance matching unit and the antenna feeding unit is 4.05 mm.

According to one or more embodiments, an energy storage system (ESS) communication system includes a system battery management system (BMS), a rack BMS, and a module BMS, wherein the system BMS, the rack BMS, and the module BMS are configured for communicating with each other, in which each of the system BMS, the rack BMS, and the module BMS includes a printed circuit board (PCB) and an antenna pattern module including an antenna mounted on a surface of the PCB, the antenna pattern modules being configured to enable wireless communication between the system BMS, the rack BMS, and the module BMS.

According to an example, the PCB may include a flexible PCB (FPCB).

According to another example, the antenna pattern module may include an antenna having an inverted-F antenna (IFA) structure.

According to another example, the antenna pattern module may include an antenna operating in a 2.4 GHz band.

According to another example, the antenna pattern module may include an antenna having a pattern mounted on a surface of the FPCB, in which the pattern has a thickness of 0.18 mm.

According to another example, the antenna pattern module may include an antenna including an antenna horizontal portion, an impedance matching unit, and an antenna feeding unit, in which a length of the antenna horizontal portion is 13.5 mm, a length of the impedance matching unit is 4.05 mm, and a length between the impedance matching unit and the antenna feeding unit is 4.05 mm.

According to one or more embodiments, a method of manufacturing a battery management system (BMS) communication system includes mounting a first printed circuit board (PCB) on a side of a housing of a battery module, the battery module including a plurality of battery cells in which a battery cell includes a voltage sensing tab, and the first PCB includes a temperature sensor, in which mounting the first PCB includes electrically connecting the temperature sensor to the voltage sensing tab of the battery cell for measuring a temperature of the battery cell, and stacking a second PCB on a surface of the first PCB, the second PCB including a cell sensing module, in which stacking the second PCB includes electrically connecting the cell sensing module to the voltage sensing tab and the temperature sensor for exchanging signals therewith, in which an antenna pattern module is mounted on a surface of the second PCB.

According to another example, the second PCB may include a flexible PCB (FPCB).

According to another example, the antenna pattern module may include an antenna having an inverted-F antenna (IFA) structure.

According to another example, the antenna pattern module may include an antenna configured to operate in a 2.4 GHz band.

According to another example, the antenna pattern module may include an antenna having a pattern mounted on a surface of the FPCB, in which the pattern has a thickness of 0.18 mm.

According to another example, the antenna pattern module may include an antenna including an antenna horizontal portion, an impedance matching portion, and an antenna feeding unit, in which a length of the antenna horizontal portion is 13.5 mm, a length of the impedance matching unit is 4.05 mm, and a length between the impedance matching unit and the antenna feeding unit is 4.05 mm.

According to one or more embodiments, a method of manufacturing an energy storage system (ESS) communication system including a system BMS, a rack BMS, and a module BMS may include performing the method of manufacturing the BMS communication system to obtain the module BMS having the antenna pattern module as a first antenna pattern module, mounting an antenna of a second antenna pattern module on a surface of a PCB of the system BMS, and mounting an antenna of a third antenna pattern module on a surface of a PCB of the rack BMS, in which the first, second, and third antenna pattern modules are configured to enable wireless communication between the system BMS, the rack BMS, and the module BMS.

According to another example, the second PCB and the PCBs of the system BMS and of the rack BMS may include flexible PCBs (FPCBs).

BRIEF DESCRIPTION OF THE DRAWINGS

The above and other aspects, features, and advantages of certain embodiments of the present disclosure will be more apparent from the following description taken in conjunction with the accompanying drawings.

The following drawings attached to this specification illustrate preferred embodiments of the present disclosure, and serve to further understand the technical idea of the present disclosure together with the detailed description of the present disclosure described later, so the present disclosure should not be construed as being limited to the matters shown in such drawings.

DETAILED DESCRIPTION

Figure 1:
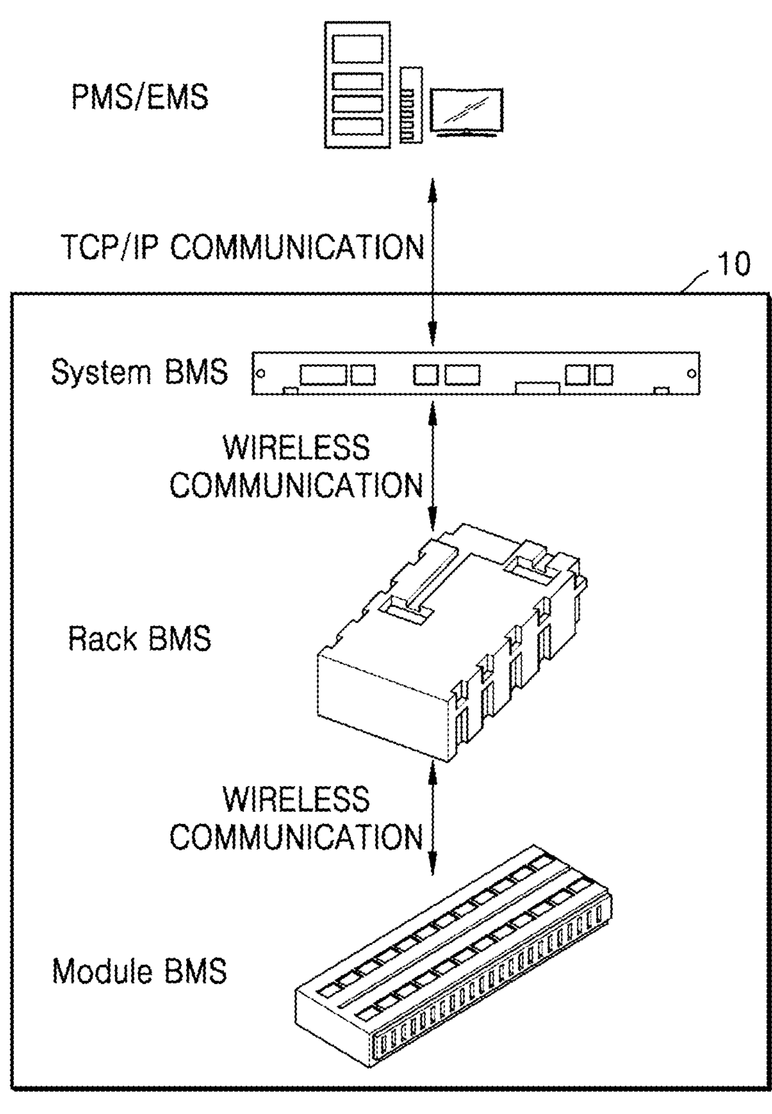
FIG. 1 schematically shows an ESS communication system according to embodiments of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," if preceding a list of elements, modify the entire list of elements and do not modify the individual elements of the list.

Hereinafter, embodiments of the present disclosure will be described in detail with reference to the accompanying drawings. The terms and words used in the present specification and claims described above should not be construed as being limited to ordinary or dictionary meanings, and should be interpreted as meanings and concepts consistent with the technical idea of the present disclosure based on the principle that the present inventors may appropriately define the concept of the terms to describe their invention in the best way. Therefore, it should be understood that the configurations shown in the drawings and embodiments described in this specification are merely the most preferred embodiments of the present disclosure, and do not represent all of the technical ideas of the present disclosure, such that there may be various equivalents and variations that replace them at the time of filing the present application. If used herein, "comprise, include" and/or "comprising, including" specify mentioned shapes, numbers, steps, operations, members, components, and/or presence of these groups, and do not exclude the presence or addition of one or more different shapes, numbers, operations, members, components, and/or groups. If embodiments of the present disclosure are described, "can" or "may" may include "one or more embodiments of the present disclosure".

To help understanding of the present disclosure, the accompanying drawings are not shown according to the actual scale, but the dimensions of some components may be exaggerated. The same reference numeral may be given to the same component in different embodiments.

The statement that two comparison targets are 'the same' as each other may mean that they are 'substantially the same' as each other. Thus, a case where they are 'substantially the same' as each other may include a case where they have a deviation regarded as a low level, e.g., a deviation of 5% or less. If a uniform parameter is uniform in a predetermined area, it may mean that it is uniform from an average point of view.

Although first, second, etc., may be used to describe various components, these components are not limited by these terms. These terms are only used to distinguish one component from other components, and unless specifically stated to the contrary, a first component may be a second component.

Throughout the specification, unless specially stated to the contrary, each component may be singular or plural.

If a component is arranged on "a top portion (or a bottom portion)" of another component or "on (or under)" the other component, it may mean not only a case where the component is arranged adjacent to a top surface (or a bottom surface) of the other component, but also a case where another component may be interposed between the other component and the component arranged on (or under) the other component.

If a component is described as being "connected", "coupled", or "connected" to another component, it should be understood that the components are directly connected or connectable to each other, but another component may be "interposed" between the components, or the components may be may be "connected", "coupled", or "connected" to each other through another component. If a portion is electrically coupled to another portion, this may include not only a case where they are directly connected to each other, but also a case where they are connected with another element therebetween.

Throughout the specification, "A and/or B" may mean A, B, or A and B unless specially stated otherwise. That is, "and/or" may include all or any combination of a plurality of items listed. "C to D" may mean at least C but not more than D, unless specially stated otherwise.

FIG. 1 schematically shows an ESS communication system according to embodiments of the present disclosure.

Referring to FIG. 1, the ESS communication system according to embodiments of the present disclosure may be a communication system between a power management system (PMS)/energy management system (EMS), a system battery management system (BMS), a rack BMS, and a module BMS, which are included in the ESS system.

For example, as shown in FIG. 1, the system BMS, the rack BMS, and the module BMS according to embodiments of the present disclosure may be included in an ESS-integrated battery box 10. For example, the battery box 10 may be a box in the shape of a container having a battery module, a BMS, a BCP, cooling equipment, and fire extinguishment monitoring and direct injection systems. In this case, communication between a PMS/EMS and a system BMS may be performed by transmission control protocol (TCP)/Internet protocol (IP) communication, but communication between the system BMS, the rack BMS, and the module BMS in the battery box 10 may cause signal interference due to complex and many wires. To solve this problem, according to the present disclosure, communication between the system BMS, the rack BMS, and the module BMS may be performed wirelessly.

For example, one battery box 10 is shown in FIG. 1, but the ESS communication system according to embodiments of the present disclosure may include a plurality of battery boxes 10. For example, the number of battery racks included in one battery box 10 may vary from 1 to 150. Preferably, the number of battery racks may vary from 10 to 100. Each battery rack may include 11 battery modules, each of which may include 22 battery cells. Herein, the module BMS may be a BMS that manages a battery module and the rack BMS may be a BMS that manages a battery rack. For example, the BMS may include a communication device, a detection device, a balancing device, a control device, etc.

For example, the BMS, which is a system that monitors a state of a battery and performs diagnosis and control, communication, and protection, may calculate a charging/discharging state, calculate a lifetime or a state of health (SOH) of the battery, block power of the battery (relay control) if required, control thermal management (cooling, heating, etc.), perform a high-voltage interlocking function, and detect or calculate an insulation and short-circuit state.

The system BMS, the rack BMS, and the module BMS according to embodiments of the present disclosure each may include an antenna pattern module for enabling wireless communication therebetween. For example, the antenna pattern module according to embodiments of the present disclosure may include an antenna mounted on a surface of a printed circuit board of each of the system BMS, the rack BMS, and the module BMS.

In case of the conventional battery box 10, which is an enclosure ESS-integrated battery box, as a container type equipped with a module, a BMS, a BCP, cooling equipment, and fire extinguishment and direct injection systems, cables such as a power line, a communication line, etc., required for each system, a duct for wiring, etc., need to be installed within a narrow space, causing high complexity and inter-signal interference and unfavorable cost in comparison to a fixed ESS. In this regard, the development of a short-range (e.g., 2.4 GHZ) wireless BMS is required to improve inter-system functionality and reduce cost. It is necessary to enable wireless communication between BMSs for efficiency and reduction of a communication error rate.

According to the present disclosure, in application of an antenna for short-range communication, to reduce a module volume, an inverted-F antenna (IFA) pattern antenna is applied to a flexible printed circuit board (FPCB) instead of an existing FR-4 rigid PCB for cost and spatial advantages.

According to the present disclosure, by mounting an antenna pattern module that performs short-range (e.g., 2.4 GHZ) wireless communication on each of the module BMS, the rack BMS, and the system BMS, problems of signal interference due to many wires in the battery box 10 may be overcome, thereby reducing communication error. In addition, by implementing an IFA pattern antenna on an FPCB, spatial advantages may be achieved. For example, wireless communication standards of the antenna pattern modules included in the module BMS, the rack BMS, and the system BMS according to embodiments of the present disclosure may include WirelessHART, IEEE 802.15.4, BLE/BLE 5.0, etc. Moreover, a wireless communication network configuration of an antenna pattern module according to embodiments of the present disclosure may include a mesh, a star, etc.

Figure 2:
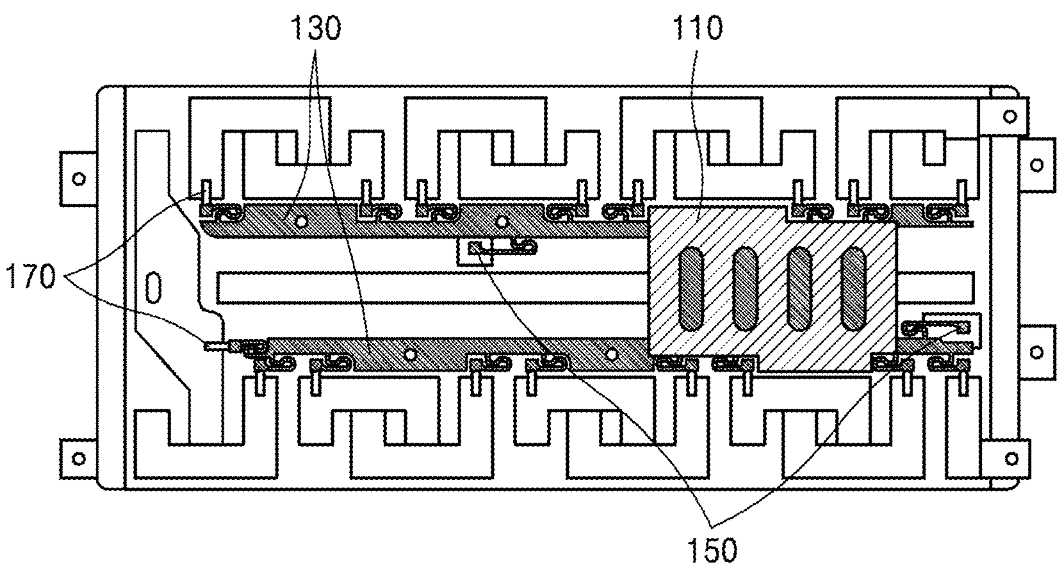
FIG. 2 schematically shows a BMS communication system mounted on a side of a housing of a battery module, according to embodiments of the present disclosure.

FIG. 2 schematically shows a BMS communication system mounted on a side of a housing of a battery module, according to embodiments of the present disclosure.

A battery module according to embodiments of the present disclosure may include a housing where an accommodation space for accommodating one or more battery cells is formed. The battery cells may be accommodated in a stacked form in the housing. Each battery cell may include an anode lead and a cathode lead. The battery cell may be of a circular type, a prismatic type, and a pouch type, depending on a shape of a battery.

The battery module may include at least one battery cell that may be a chargeable secondary battery. For example, the battery cell may include at least one selected from a group including a nickel-cadmium battery, a lead acid battery, a nickel metal hydride battery (NiMH), a lithium ion battery, a lithium polymer battery, etc. For example, the number of battery cells included in the battery module and a connection scheme thereof may be determined based on a power amount, a voltage, etc., required for the battery module. For example, the battery cells may be connected in parallel to each other or in parallel and in series to each other.

Referring to FIG. 2, the BMS communication system according to embodiments of the present disclosure may include a first PCB 130 and a second PCB 110.

The first PCB 130 may be mounted on a side of a housing of a battery module including a plurality of battery cells. For example, as shown in FIG. 2, the first PCB 130 may be electrically connected to a voltage sensing tab 170 of a battery cell. Moreover, the first PCB 130 may include a temperature sensor 150 that measures a temperature of the battery cell.

The second PCB 110 may be stacked on a surface of the first PCB 130. For example, as shown in FIG. 2, the second PCB 110 may include a cell sensing module that is electrically connected to the voltage sensing tab 170 and the temperature sensor 150 to exchange signals, and an antenna pattern module may be mounted on a surface of the second PCB 110.

Figure 3:
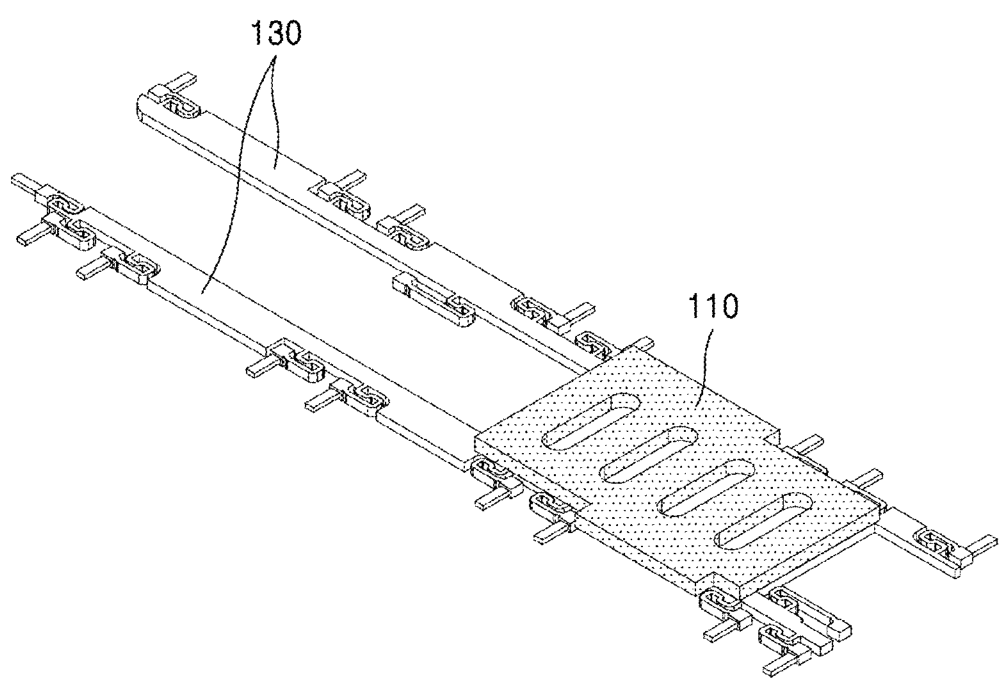
FIGS. 3 and 4 schematically show a printed circuit board (PCB) having mounted thereon an antenna pattern module according to embodiments of the present disclosure.
Figure 4:
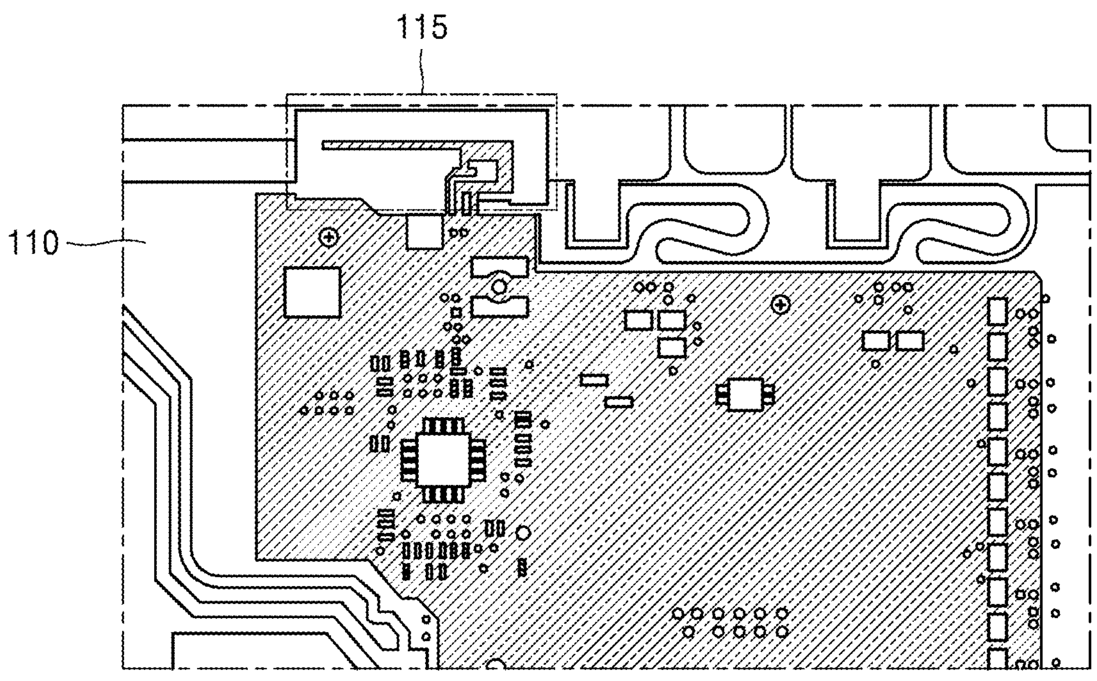
Figure 5:
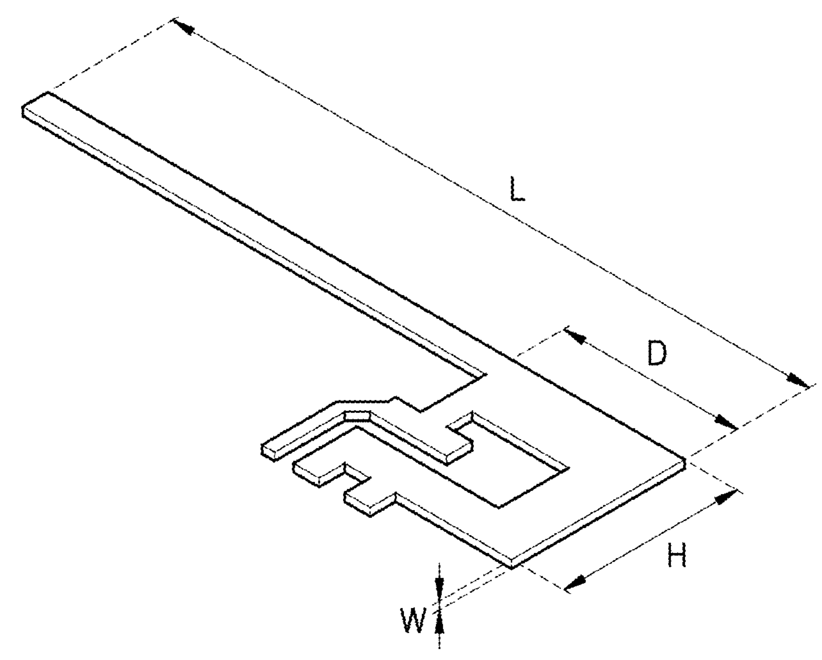
FIG. 5 schematically shows an antenna according to embodiments of the present disclosure.

FIGS. 3 and 4 schematically show a PCB having mounted thereon an antenna pattern module according to embodiments of the present disclosure. FIG. 5 schematically shows an antenna according to embodiments of the present disclosure.

First, referring to FIG. 3, the first PCB 130 and the second PCB 110 according to embodiments of the present disclosure are schematically shown.

Existing pattern antennas are mounted on FR-4 and rigid PCB for radio frequency (RF) signal matching, thus being disadvantageous in terms of volume, space, and cost, but an antenna pattern module according to the present disclosure may be mounted on the surface of the second PCB 110 and the second PCB 110 may be stacked on a surface of the first PCB 130 in a vertical structure, thereby removing a need for a separate mounting space and thus providing spatial and cost advantages. For example, the second PCB 110 may be stacked by being connected between the first PCB 130 and the second PCB 110 by a vertical stiffener.

The second PCB 110 according to embodiments of the present disclosure may be a FPCB. The first PCB 130 and the second PCB 110 according to embodiments of the present disclosure may be FPCBs.

Referring to FIG. 4 together, an antenna pattern module 115 mounted on the second PCB 110 according to embodiments of the present disclosure is schematically shown. For example, the antenna pattern module 115 may include an antenna including a conductor line mounted on the surface of the second PCB 110.

The antenna pattern module 115 according to embodiments of the present disclosure may include an antenna having an IFA structure. For example, referring to FIGS. 4 and 5 together, the antenna pattern module 115 according to embodiments of the present disclosure may include an antenna operating in a 2.4 GHz band.

For example, as shown in FIG. 5, the antenna pattern module 115 according to embodiments of the present disclosure may include an antenna in which a length L of an antenna horizontal portion is about 13.5 mm, a length H of an impedance matching unit is about 4.05 mm, and a length D between the impedance matching unit and an antenna feeding unit is about 4.05 mm. Moreover, the antenna pattern module 115 may include an antenna in which a thickness W of a pattern mounted on the surface of the FPCB is about 0.18 mm.

For an existing short-range 2.4 GHz band wireless BMS, performance is achieved when a pattern thickness is designed to be about 1 mm or greater in application of a chip-type, wire-type, or pattern-type (meander-IFA (MIFA), IFA) antenna to a rigid PCB (FR-4), thus being unapplicable to an FPCB, but according to the present disclosure, by implementing pattern impedance matching of an antenna pattern module, an IFA structure may be applied in which a pattern thickness is an FPCB standard thickness (about 0.2 mm or less), thereby securing performance similar to an FR-4 applied type.

While the present disclosure is described by limited embodiments and drawings, the present disclosure is not limited thereby and various modifications and changes may be made by those of ordinary skill in the art within the technical spirit of the present disclosure and the equivalent range to the claims set forth below.

Various embodiments of the present disclosure may be implemented in the form of a computer program executable on a computer through various components, and the computer program may be recorded on a computer-readable medium. The medium may continuously store an executable program or temporarily store the same for execution or downloading. The medium may include various recording means or storage means in a form of single hardware or a combination of several hardware, and may be distributed over a network without being limited to a medium directly connected to a certain computer system. Examples of the medium may include a magnetic medium such as a hard disk, a floppy disk, and a magnetic tape, an optical recording medium such as a compact disc (CD)-read-only memory (ROM) and a digital versatile disk (DVD), a magneto-optical medium such as a floptical disk, ROM, random-access memory (RAM), flash memory, etc., to store a program instruction. Other examples of the medium may include a recording medium or a storage medium managed by an app store that distributes applications, a site that supplies or distributes various software, a server, etc.

In the specification, the term "unit", "module", etc., may be a hardware component like a processor or a circuit, and/or a software component executed by a hardware component like a processor. For example, "unit", "module", etc., may be implemented by components such as software components, object-oriented software components, class components, and task components, processes, functions, properties, procedures, subroutines, segments of program code, drivers, firmware, microcode, circuits, data, a database, data structures, tables, arrays, and variables.

According to the present disclosure, in the BMS communication system and the ESS communication system that wirelessly communicate with each other, communication between the BMSs may be performed wirelessly, thereby performing efficient communication.

However, effects that may be obtained through the present disclosure are not limited to the above-described effects, and other technical effects not mentioned may be clearly understood by those of ordinary skill in the art from the description of the present disclosure described below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims.

What is claimed is:

1. A battery management system (BMS) communication system comprising:

a battery module comprising a housing and a plurality of battery cells in which a battery cell comprises a voltage sensing tab;

a first printed circuit board (PCB) mounted on a side of the housing of the battery module and comprising a temperature sensor electrically connected to the voltage sensing tab of the battery cell to measure a temperature of the battery cell; and a second PCB stacked on a surface of the first PCB and comprising a cell sensing module electrically connected to the voltage sensing tab and the temperature sensor to exchange signals therewith, wherein an antenna pattern module is mounted on a surface of the second PCB.

2. The BMS communication system as claimed in claim 1, wherein the second PCB comprises a flexible PCB (FPCB).

3. The BMS communication system as claimed in claim 2, wherein the antenna pattern module comprises an antenna having an inverted-F antenna (IFA) structure.

4. The BMS communication system as claimed in claim 3, wherein the antenna pattern module comprises an antenna configured to operate in a 2.4 GHz band.

5. The BMS communication system as claimed in claim 3, wherein the antenna pattern module comprises an antenna having a pattern mounted on a surface of the FPCB, wherein the pattern has a thickness of 0.18 mm.

6. The BMS communication system as claimed in claim 5, wherein the antenna pattern module comprises an antenna comprising an antenna horizontal portion, an impedance matching unit, and an antenna feeding unit, in which a length of the antenna horizontal portion is 13.5 mm, a length of the impedance matching unit is 4.05 mm, and a length between the impedance matching unit and the antenna feeding unit is 4.05 mm.

7. An energy storage system (ESS) communication system comprising:

a system battery management system (BMS);

a rack BMS; and a module BMS, wherein the system BMS, the rack BMS, and the module BMS are configured for communicating with each other, wherein each of the system BMS, the rack BMS, and the module BMS comprises a printed circuit board (PCB) and an antenna pattern module, the antenna pattern module comprising an antenna mounted on a surface of the PCB, the antenna pattern modules being configured to enable wireless communication between the system BMS, the rack BMS, and the module BMS, and wherein the antenna pattern module of the module BMS is mounted on a surface of a second PCB stacked vertically on a first PCB.

8. The ESS communication system as claimed in claim 7, wherein the PCB comprises a flexible PCB (FPCB).

9. The ESS communication system as claimed in claim 8, wherein the antenna pattern module comprises an antenna having an inverted-F antenna (IFA) structure.

10. The ESS communication system as claimed in claim 9, wherein the antenna pattern module comprises an antenna operating in a 2.4 GHz band.

11. The ESS communication system as claimed in claim 9, wherein the antenna pattern module comprises an antenna having a pattern mounted on a surface of the FPCB, wherein the pattern has a thickness of 0.18 mm.

12. The ESS communication system as claimed in claim 11, wherein the antenna pattern module comprises an antenna comprising an antenna horizontal portion, an impedance matching unit, and an antenna feeding unit, in which a length of the antenna horizontal portion is 13.5 mm, a length of the impedance matching unit is 4.05 mm, and a length between the impedance matching unit and the antenna feeding unit is 4.05 mm.

13. A method of manufacturing a battery management system (BMS) communication system, the method comprising:

mounting a first printed circuit board (PCB) on a side of a housing of a battery module, the battery module comprising a plurality of battery cells in which a battery cell comprises a voltage sensing tab, and the first PCB comprising a temperature sensor, wherein mounting the first PCB comprises electrically connecting the temperature sensor to the voltage sensing tab of the battery cell for measuring a temperature of the battery cell; and stacking a second PCB on a surface of the first PCB, the second PCB comprising a cell sensing module, wherein stacking the second PCB comprises electrically connecting the cell sensing module to the voltage sensing tab and the temperature sensor for exchanging signals therewith, wherein an antenna pattern module is mounted on a surface of the second PCB.

14. The method as claimed in claim 13, wherein the second PCB comprises a flexible PCB (FPCB).

15. The method as claimed in claim 14, wherein the antenna pattern module comprises an antenna having an inverted-F antenna (IFA) structure.

16. The method as claimed in claim 15, wherein the antenna pattern module comprises an antenna configured to operate in a 2.4 GHz band.

17. The method as claimed in claim 15, wherein the antenna pattern module comprises an antenna having a pattern mounted on a surface of the FPCB, wherein the pattern has a thickness of 0.18 mm.

18. The method as claimed in claim 17, wherein the antenna pattern module comprises an antenna comprising an antenna horizontal portion, an impedance matching unit, and an antenna feeding unit, in which a length of the antenna horizontal portion is 13.5 mm, a length of the impedance matching unit is 4.05 mm, and a length between the impedance matching unit and the antenna feeding unit is 4.05 mm.

19. A method of manufacturing an energy storage system (ESS) communication system comprising a system BMS, a rack BMS, and a module BMS, the method comprising:

performing the method as claimed in claim 13 to obtain the module BMS having the antenna pattern module as a first antenna pattern module;

mounting an antenna of a second antenna pattern module on a surface of a PCB of the system BMS; and mounting an antenna of a third antenna pattern module on a surface of a PCB of the rack BMS, wherein the first, second, and third antenna pattern modules are configured to enable wireless communication between the system BMS, the rack BMS, and the module BMS.

20. The method as claimed in claim 19, wherein the second PCB and the PCBs of the system BMS and of the rack BMS comprise flexible PCBs (FPCBs).

* * * * *